(12) United States Patent
Köppel et al.

(10) Patent No.: US 8,194,388 B2
(45) Date of Patent: Jun. 5, 2012

(54) ELECTRIC COMPONENT COMPRISING EXTERNAL ELECTRODES AND METHOD FOR THE PRODUCTION OF AN ELECTRIC COMPONENT COMPRISING EXTERNAL ELECTRODES

(75) Inventors: Harald Köppel, Köflach (AT); Robert Krumphals, Deutschlandsberg (AT); Axel Pecina, St. Peter im Sulmtal (AT)

(73) Assignee: EPCOS AG, Munich (DE)

( * ) Notice: Subject to any disclaimer, the term of this patent is extended or adjusted under 35 U.S.C. 154(b) by 61 days.

(21) Appl. No.: 11/659,439

(22) PCT Filed: Aug. 3, 2005

(86) PCT No.: PCT/DE2005/001377
§ 371 (c)(1),
(2), (4) Date: Sep. 6, 2007

(87) PCT Pub. No.: WO2006/012889
PCT Pub. Date: Feb. 9, 2006

(65) Prior Publication Data
US 2008/0095991 A1    Apr. 24, 2008

(30) Foreign Application Priority Data
Aug. 3, 2004 (DE) .......................... 10 2004 037 588

(51) Int. Cl.
*H01G 4/06* (2006.01)
(52) U.S. Cl. ........................................ 361/303; 361/311
(58) Field of Classification Search .... 361/301.1–321.2, 361/303, 311
See application file for complete search history.

(56) References Cited

U.S. PATENT DOCUMENTS

| | | | |
|---|---|---|---|
| 4,701,827 A | 10/1987 | Fujikawa et al. | |
| 5,245,309 A | 9/1993 | Kawase | |
| 5,712,758 A * | 1/1998 | Amano et al. | 361/321.2 |
| 5,866,196 A * | 2/1999 | Ueno et al. | 427/79 |
| 6,813,137 B2 * | 11/2004 | Matsuoka et al. | 361/305 |
| 6,965,167 B2 * | 11/2005 | Liu | 257/777 |
| 6,984,543 B2 * | 1/2006 | Mihara et al. | 438/55 |
| 7,012,501 B2 | 3/2006 | Krumphals et al. | |
| 7,084,732 B2 | 8/2006 | Krumphals | |
| 7,123,467 B2 | 10/2006 | Greier et al. | |
| 7,135,955 B2 | 11/2006 | Feichtinger et al. | |
| 7,341,639 B2 | 3/2008 | Greier et al. | |

(Continued)

FOREIGN PATENT DOCUMENTS

DE    42 07 915    9/1992

(Continued)

OTHER PUBLICATIONS

English translation of Written Opinion for PCT/DE2005/001377.

(Continued)

*Primary Examiner* — Cathy Lam
(74) *Attorney, Agent, or Firm* — Fish & Richardson P.C.

(57) ABSTRACT

An electrical component includes a ceramic base body that includes a surface that is partially ceramic, electrodes in the ceramic base body that have ends that form parts of the surface of the ceramic base body, and a bonding layer on the surface of the ceramic base body. The bonding layer has a composition such that, when the bonding layer is heated, the bonding layer is less adhesive to the ends of the electrodes than when not heated.

24 Claims, 2 Drawing Sheets

U.S. PATENT DOCUMENTS

2006/0249758 A1  11/2006  Feichtinger et al.

FOREIGN PATENT DOCUMENTS

| | | |
|---|---|---|
| DE | 197 14 686 | 10/1998 |
| DE | 100 18 377 | 12/2001 |
| DE | 101 59 451 | 6/2003 |
| EP | 0 751 390 | 1/1997 |
| JP | 05-251210 | 9/1993 |
| JP | 08-115845 | 5/1996 |
| JP | 10-149942 | 6/1998 |
| JP | 11-219846 | 8/1999 |
| JP | 01-135501 | 5/2001 |

OTHER PUBLICATIONS

English translation of examination report dated Aug. 16, 2010 received in corresponding application JP 2007-524173.

Examination report dated Aug. 16, 2010 received in corresponding application JP 2007-524173.

International Search Report in Application No. PCT/DE2005/001377, dated Oct. 19, 2005.

Written Opinion in Application No. PCT/DE2005/001377, dated Oct. 19, 2005.

* cited by examiner

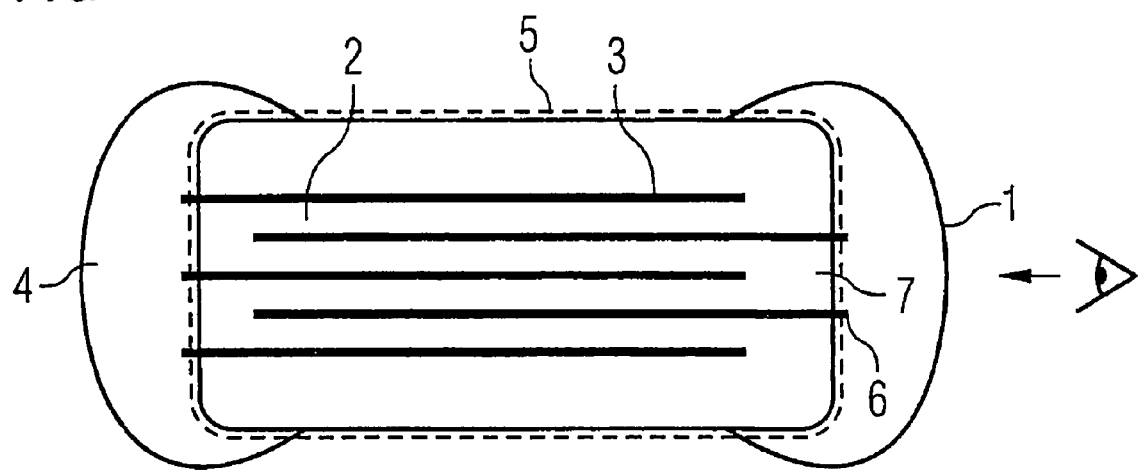
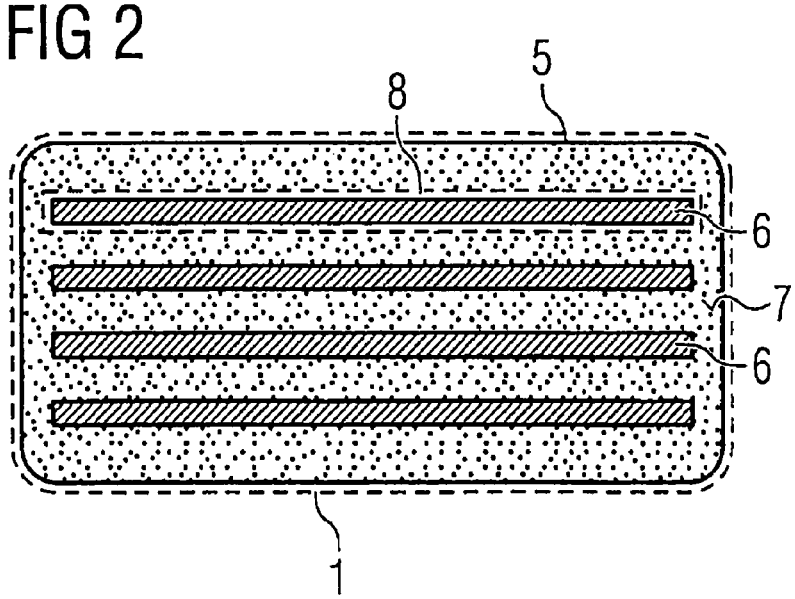

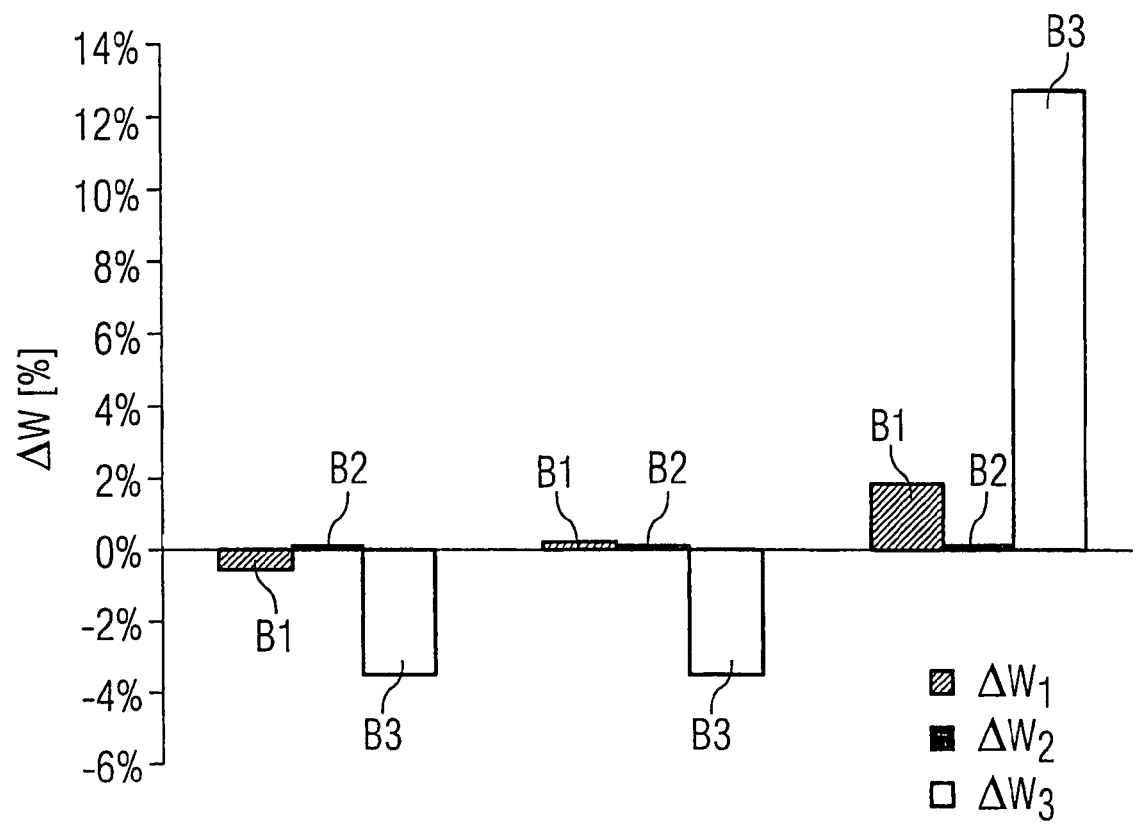

ELECTRIC COMPONENT COMPRISING EXTERNAL ELECTRODES AND METHOD FOR THE PRODUCTION OF AN ELECTRIC COMPONENT COMPRISING EXTERNAL ELECTRODES

TECHNICAL FIELD

This patent application relates to an electrical component, such as an NTC component, and also to fabrication of the electrical component.

BACKGROUND

An electroceramic component includes electrically conductive contact bodies on a ceramic base body surface, which are used for making electrical contacts and which, among other things, enable SMD (surface mounted device) mounting. These electrically conductive contact bodies, or terminations, are usually comprised of a material that is different from that of the ceramic base body. As a result, problems arise with adhering the contact bodies to the base body.

U.S. Pat. No. 5,245,309 describes a ceramic NTC component in which a ceramic base body is fabricated using multi-layer technology and is comprised of ceramic layers with internal electrodes arranged in these layers. These internal electrodes each contact an outer contact body and form an electrode terminal. Furthermore, an outer passivation layer, e.g., glass, can be applied on a surface of the component. With this technology, it is possible to obtain different electrical resistances by varying the arrangement of the internal electrodes for components with a same component standard.

DE 10159451 A1 describes an NTC component with a base body, which is comprised of at least first and second spatially formed ceramic area parts made from different NTC materials. At least one first and one second contact layer are on a surface of the base body. It is possible to fabricate NTC components with different electrical characteristics by varying both the arrangement and the relative portions of the two ceramic area parts in the base body, and also by varying material combinations without changing the dimensions of the base body.

DE 4207915 describes that a resistance value of a thermistor element can be changed by varying a distance between ends of its internal electrodes. In this way, it is possible to avoid production of low-resistance NTC components that are particularly thin, and therefore susceptible to damage through fractures or cracks.

SUMMARY

Described herein is an electrical component that comprises a ceramic base body with a partially ceramic surface, and a plurality of electrodes arranged in the ceramic base body. The ends of the electrodes form a part of the surface of the base body. The surface of the base body includes a bonding layer having a composition with a bonding strength that decreases when heated at ends of the electrodes.

According to one embodiment, the electrical component has at least one electrical contact body applied to a surface of the base body and connected to ends of the electrodes in an electrically conductive way. The surface of the base body includes a bonding layer for at least partly connecting the contact body to the ceramic part of the surface of the base body.

In the foregoing electrical component, only the bonding layer is run off/purged when it is heated by the electrode ends. The resulting exposed area allows contacts to be made between the contact bodies and the electrode ends. This is done without a bonding layer remaining between the electrode ends and the contact body which, to a significant extent, changes the resistance value of the electrical component.

Thus a maximum surface area of the ceramic surface of the base body can be used for bonding with the contact body. The ceramic base body also includes a bonding layer that protects against adverse environmental conditions in an area where the contact body is not on the substrate.

The contact bodies can be implemented as contact layers or as ends of contact wires that create a connection to an external current and voltage source.

Advantageously, the contact bodies are connected to ceramic areas of the ceramic surface due to a special characteristic of the bonding layer, even though they are also through-contacted with electrode ends arranged in the same area.

Another advantage is that the contact bodies bond more strongly with the ceramic substrate and, therefore, have a high pull-off resistance.

Heretofore, during a thermal fixing phase, contact bodies could only be burned in on the ceramic substrate with simultaneous and considerable change to the basic resistance value of the electrical component. In the electrical components described herein, an effect of burning-in the contact bodies on resistance value of the electrical component is reduced by virtue of the coating on the ceramic substrate. This is because bonding and decoupling layers no longer have to be bonded to the electrode ends and the through-contact of the electrodes to the contact body is particularly clean. In addition, the ceramic substrate is electrically insulated from the contact bodies so that a reduced change in the basic resistance value of the electrical component can also be achieved. For this purpose, the bonding layer is electrically insulating and is thus also a decoupling layer.

The reduced adhesion of the bonding layer to the ends of the electrodes may be in a temperature range between 50 to 200 K below the burn-in temperature of the contact body. As a result, during burn-in of the contact body on the ceramic substrate, sufficient softening of the bonding layer takes place so that only the bonding layer is purgeable/runs off from the ends of the electrodes. The bonding layer may comprise a lead-borosilicate mixture so that it is thoroughly purgeable from the ends of the electrodes during softening.

Also described herein is a method for fabricating an electrical component. According to the method, a ceramic base body is generated with a partially ceramic surface. A plurality of electrodes are formed in an interior of the ceramic base body in such a manner that the ends of the electrodes form a part of the surface. The surface of the base body is wetted with a bonding layer that bonds poorly to the ends of the electrodes at a given temperature. Poor bonding is understood to mean that the bonding layer no longer adheres to the ends of the electrodes when heated.

The fabrication process may be extended so that a contact body is applied to the base body. The electrical component is heated during a thermal fixing phase so that the bonding layer is run off/purged from the parts of the surface of the base body formed with electrodes, and a through-contact of the contact body to the ends of the electrodes is formed.

The term "thermal fixing phase" is understood to be a thermal phase in which the contact bodies are burned-in on the ceramic base body—the burn-in of the contact bodies is thus a part of the thermal fixing phase.

Embodiments are explained in more detail with reference to the following figures.

DESCRIPTION OF THE DRAWINGS

FIGS. 1 and 2 show a longitudinal view and cross-sectional view, respectively, of an embodiment of an electrical NTC component, and FIG. 3 shows the behavior of three ceramic base bodies with or without a bonding and decoupling layer in certain fabrication steps at different temperatures.

DETAILED DESCRIPTION

FIG. 1 shows a ceramic base body 2, which may comprise a manganese-nickel oxide mixture. Electrodes 3 are arranged in parallel in ceramic base body 2. Each of these electrodes extends to the surface with one end 6 and thus forms a part of the surface of ceramic base body 2. Simultaneously, a bonding and decoupling layer 5 is applied to the ceramic base body.

The electrodes may comprise a silver-palladium (Ag—Pd) alloy. The contact bodies comprise a base metallization made from silver (Ag) that may be reinforced galvanically with a nickel and a tin layer.

An electrical NTC component such as that of FIG. 1 may be fabricated in the following way: a glass layer 5 is applied to the sintered ceramic base body 2. This may be done via a method for depositing thin layers, e.g., through immersion in a glass slurry, spraying of a glass slurry, and subsequent or accompanying drying. The glass slurry may include a bonding agent, which improves adhesion of the resulting dried layer. Typical layer thicknesses, dried green, are in a range between 1 and 20 μm. An exemplary glass slurry includes 100 g of glass powder, 3-20 g of bonding agent, and 500-1000 g of water. As a bonding agent, the following may be used: cellulose derivatives, carboxymethyl cellulose, hydroxypropylmethyl cellulose, polyvinyl alcohol, polyethylene glycol, and silicone resins.

The composition of the glass is tailored to the wetting of the ceramic body, i.e., the ceramic surface of the ceramic substrate. A typical composition of the glass can stem from the systems B—Si (borosilicate), in particular, lead-borosilicate (Pb—B—Si), or Zn—B—Si (zinc borosilicate) optionally with other additives, for example Ba, Al, Cu, Fe, Cr, Mg. The coated ceramic base body 2 obtained in this way includes contact bodies or terminations 4 obtained through immersion and drying. After the contact bodies are applied to the ceramic substrate for the first time, the bonding layer bonds to the surface of the contact body, since its surface has a composition that causes the bonding layer to penetrate between particles of the contact body surface. A permanent bond between the contact body and the bonding layer is, therefore, also guaranteed in the later thermal fixing phase. Thermal fixing, typically in the range between 650° C. and 850° C., follows thereafter.

The glass is such that its softening point is ca. 50-200 K below the burn-in temperature of the contact body or the termination. In this thermal fixing phase, the bonding layer is heated to a temperature at which it begins to soften and is finally run-off/purged from the ends of the electrodes. Thus, the bonding layer remains bonded to the ceramic surface of the ceramic base body, but not to the ends of the electrodes, thereby enabling formation of a through-contact from the termination or the contact body to the ends of the electrodes. The through-contacts of the contact bodies to the electrode ends are obtained, since the contact body partially softens during the thermal fixing phase and thus flows onto the electrode ends. This liquefied contact body material may then harden and thus forms a solid electrical contact to the electrodes.

The composition of the bonding layer is such that the general interaction between the glass and the electrode material is considered insofar as removal of the softened glass layer in the thermal fixing phase is simplified. In general, care is to be taken that the electrode ends are comprised of a different material than the contact bodies to the extent that the bonding layer forms a significantly poorer bond to the electrode ends than to the contact bodies.

Due to the running off/purging of the bonding layer from the electrode ends during the thermal fixing phase, the previously common processing step in which the bonding layer parts still bonded to the ends of the electrodes must be ablated, is eliminated. The thickness of the bonding layer applied to the surface of the ceramic substrate is such that a complete softening of the bonding layer at the ends of the electrodes can be achieved during the thermal fixing phase.

The bonding layer remaining between the contact bodies and the ceramic surface of the ceramic base body produces a reinforced pull-off resistance of the contact body, resulting in a pull-off resistance of the contact body of up to 50 N. In contrast, reference components without a bonding layer between the contact bodies and the ceramic surface can have a defect percentage of typically 10-20% during a peel-off test. The component described herein passes this test with 100%.

The change in the basic resistance value of the electrical component through the burning-in of the contact body can be reduced from ca. 12% to below 4%. The change in the resistance of the ceramic base body during galvanic reinforcement of the contact body, caused by ceramic removal at the exposed surface of the ceramic substrate in acid galvanic baths, is reduced from 2% to below 0.5% (see FIG. 3). In the case of NTC components on basis of spinel, the sensitivity of the resistance value of the ceramic component vis-à-vis the burning-in of terminations on the ceramic base body is reduced by the bonding and decoupling layer.

The ceramic base body may be fabricated using known multilayer technology.

The bonding layer applied to the areas of the base body that are not between the contact body and the base body is used as a protective layer that is resistant to adverse environmental conditions in other processing steps, for example, during galvanic reinforcement of the termination with nickel-tin layers or during onset of flux material during soldering.

FIG. 2 shows a view of the electrical component 1 in the direction of the arrow shown in FIG. 1. The area 8 free of the bonding layer is shown schematically around one electrode end 6. The contact body 4, which is, in this perspective, between the viewer of the electrical component and the ceramic base body, is not drawn in order that the cross section of the electrical component is visible.

FIG. 3 shows the change in the resistance value, $\Delta W$, of three ceramic base bodies with or without a bonding or coupling layer in certain fabrication steps at different temperatures.

The left group of bars shows the case when the ceramic base body has a bonding layer. More specifically:

1. The left bar B1 shows a small change in the resistance value, $\Delta W_1$, of the ceramic base body in a period of 10 min before and after the galvanic reinforcement of the termination at 25° C.

2. The central bar B2 shows a minor change in the resistance value of the base body in a period of 10 min before and after the galvanic reinforcement of the termination at temperatures between 25 and 100° C.

3. The right bar B3 shows the negative change in the resistance value of the ceramic base body during the thermal fixing phase.

The central group of bars shows the case when the ceramic base body has a bonding layer; this time with a thicker layer deposit, which includes a waiting time of 20 min after the above time points 1 to 3, until the resistance value is measured. As in the left group of bars, a high stability of the resistance value of the ceramic base body is also shown.

The right group of bars shows the reference case in which there is no bonding and decoupling layer according to the state of the art between the contact body or the termination and the ceramic substrate. In this case, the changes in the resistance values of the ceramic substrate in the above cases 1 to 3 are much higher.

The invention claimed is:

1. An electrical component comprising:
    a ceramic base body comprising a surface, wherein the ceramic base body comprises a manganese-nickel oxide mixture;
    inner electrodes in the ceramic base body, the surface comprising a first part and a second part, the first part comprising ceramic, the second part comprising ends of the inner electrodes; and
    a bonding layer on at least part of the surface of the ceramic base body, the bonding layer comprising a borosilicate glass mixture, and the bonding layer covering at least partially the first part and the second part, the bonding layer being configured to melt from at least some of the ends of the inner electrodes, but not from the ceramic base body, in response to heating.

2. The electrical component of claim 1, further comprising:
    at least one electrical contact body adjacent to the surface of the ceramic base body and electrically connected to at least some of the ends of the inner electrodes.

3. The electrical component of claim 2, wherein the bonding layer is less adhesive to the ends of the inner electrodes in a temperature range between 50° K and 200° K below a burn-in temperature of the at least one electrical contact body.

4. The electrical component of claim 1, wherein the bonding layer is electrically insulating.

5. The electrical component of claim 1, wherein the bonding layer is a protective layer to protect the ceramic base body from adverse environmental conditions.

6. The electrical component of claim 1, wherein the bonding layer comprises a lead-borosilicate (Pb—B—Si) mixture.

7. The electrical component of claim 1, wherein the bonding layer further comprises one or more of the following materials: Ba, Al, Cu, Fe, Cr, and Mg.

8. The electrical component of claim 1, wherein a composition of the bonding layer is such that the bonding layer remains adhered to ceramic parts of the surface of the ceramic base body after removal from at least some of the end of the inner electrodes.

9. The electrical component of claim 1, wherein the bonding layer completely covers the first and second parts of the surface of the ceramic base body.

10. The electrical component of claim 1, wherein the bonding layer completely covers the first part and partially covers the second part.

11. An electrical component comprising:
    a base body comprising a ceramic and electrodes among the ceramic, the ceramic comprising a a manganese-nickel oxide mixture, the electrodes having ends that reach a surface of the base body;
    at least one contact body; and
    a bonding layer comprising a manganese-nickel oxide mixture, the bonding layer being formed between the base body and the at least one contact body and the bonding layer covering, at least partially, an area comprising the ceramic and the ends of at least some of the electrodes, the bonding layer being configured to melt from at least some of the ends of the electrodes, but not from the ceramic, in response to heating;
    wherein the bonding layer bonds to a surface of the base body and to a surface of the at least one contact body.

12. The electrical component of claim 11, wherein the at least one contact body and at least some of the ends of the electrodes are electrically connected.

13. The electrical component of claim 11, wherein the bonding layer completely covers the ceramic and ends of at least some of the electrodes.

14. The electrical component of claim 11, wherein the bonding layer provides protection from mechanical strain, and wherein the protection comprises increased pull-off resistance between the at least one contact body and the manganese-nickel oxide mixture ceramic.

15. An electrical component comprising:
    a ceramic base body comprising a manganese-nickel oxide mixture, the ceramic base body having a surface;
    electrodes in the ceramic base body, the surface comprising a first part and a second part, the first part comprising ceramic, the second part comprising ends of the electrodes; and
    a bonding layer comprising a borosilicate glass mixture, the bonding layer being on at least part of the surface of the ceramic base body and the bonding layer covering, at least partially, an area comprising the first part and the second part, the bonding layer being configured to melt from at least some of the ends of the electrodes, but not from the ceramic base body, in response to heating, the bonding layer comprising a protective layer to protect the ceramic base body from adverse environmental conditions, the adverse environmental conditions comprising acidic solutions or aqueous solutions.

16. The electrical component of claim 15, wherein the adverse environmental conditions comprise high temperatures.

17. An electrical component comprising:
    a ceramic base body comprising a manganese-nickel oxide mixture, the ceramic base body having a surface;
    electrodes comprised of a first material in the ceramic base body, the surface comprising a first part and a second part, the first part comprising ceramic, the second part comprising ends of the electrodes;
    at least one contact body comprising a second material; and
    a bonding layer comprising a borosilicate glass mixture, the bonding layer being on at least part of the surface and the bonding layer covering, at least partially, an area comprising the first part and the second part, the bonding layer being configured to melt from at least some of the ends of the electrodes, but not from the ceramic, in response to heating;
    wherein the bonding layer is between the surface and the at least one contact body, the bonding layer bonding to the surface and to the at least one contact body; and
    wherein the bonding layer adheres more strongly to the at least one contact body than to the ends of the electrodes.

18. A method of fabricating an electrical component comprising:
    forming a ceramic base body that comprises manganese-nickel oxide and that has a surface, the ceramic base body comprising electrodes in an interior of the ceramic base body, the surface of the ceramic base body comprising a first part and a second part, the first part comprising ceramic and the second part comprising ends of the electrodes; and applying a bonding layer that comprises a borosilicate glass mixture to the surface of the ceramic base body, the bonding layer being configured to melt from at least some of the ends of the electrodes, but not from the ceramic, in response to heating.

19. The method of claim 18, further comprising:

applying a contact body to the bonding layer;

heating the electrical component during a thermal fixing phase so that the bonding layer is removed from the second part of the surface so that a contact comprised of ends of electrodes is formed to the contact body.

20. The method of claim 18, wherein the bonding layer comprises a lead-borosilicate mixture.

21. The method of claim 18, wherein the bonding layer comprises one or more of the following materials: Ba, Al, Cu, Fe, Cr, and Mg.

22. The method of claim 18, wherein the ceramic base body is formed via multilayer technology.

23. The method of claim 18, further comprising:

forming contact bodies that make electrical contact with the ends of electrodes at the second part of the surface of the ceramic base body, the contact bodies comprising a base metallization comprising silver (Ag).

24. The method of claim 23, wherein the silver is reinforced galvanically with nickel and tin.

* * * * *